United States Patent [19]

Hunter

[11] 4,331,708
[45] May 25, 1982

[54] METHOD OF FABRICATING NARROW DEEP GROOVES IN SILICON

[75] Inventor: William R. Hunter, Garland, Tex.

[73] Assignee: Texas Instruments Incorporated, Dallas, Tex.

[21] Appl. No.: 203,842

[22] Filed: Nov. 4, 1980

[51] Int. Cl.³ ............................................ H01L 21/76
[52] U.S. Cl. ...................................... 427/93; 427/94; 156/643; 156/657; 156/659.1
[58] Field of Search ................... 427/94, 93; 156/648, 156/649, 653, 662, 659.1

[56] References Cited

U.S. PATENT DOCUMENTS

| | | | |
|---|---|---|---|
| 4,001,465 | 1/1977 | Graul et al. | 427/94 |
| 4,104,086 | 8/1978 | Bondur et al. | 156/648 |
| 4,172,005 | 10/1979 | Muraoka et al. | 156/659 |

Primary Examiner—Ralph S. Kendall
Attorney, Agent, or Firm—Jim Comfort; Mel Sharp; Robert Groover

[57] ABSTRACT

A method of fabricating deep grooves having submicron widths in a semiconductor substrate. A pattern of submicron oxidation masking elements formed on the substrate surface serves as an oxidation mask for a thick oxide layer. After forming the oxide layer, the insulating elements are removed to form a pattern of submicron width openings in the oxide extending to the substrate. A selective anisotropic dry etch is then used to form deep, narrow grooves in the substrate conforming to the pattern of openings which are filled with an insulating material formed by thermal oxidation, chemical vapor deposition, or a combination thereof. This process is used to provide deep dielectric isolation between active areas in high density integrated circuits.

13 Claims, 15 Drawing Figures

METHOD OF FABRICATING NARROW DEEP GROOVES IN SILICON

BACKGROUND OF THE INVENTION

This invention relates generally to microelectronic semiconductor device fabrication and more particularly to a method of improving isolation between active areas in such devices.

The development of semiconductor integrated circuit design has been characterized by a trend toward increasing circuit densities. As the number of devices per chip has increased, various methods and structures have been devised to improve the isolation between devices. One method is to grow insulating oxide regions between devices. However, the oxide tends to spread laterally in direct proportion to the oxide thickness resulting in a barrier having a width substantially equal to its depth, which uses up valuable space on the chip surface. In a typical MOS device the isolating oxide region formed by conventional local oxidation techniques around the device perimeter has a width of about 2.5 microns. If the isolating oxide width were reduced to one micron or less, more than twice the number of circuit elements could be formed in a given chip surface area.

A problem that arises during the fabrication of CMOS devices is the avoidance of latchup, for example, the parasitic lateral npn devices formed by the n+ source and drain diffusions of n-channel devices in the p-type epitaxial layer itself. One solution is to form p+ reachthrough diffusions to the p+ substrate to isolate the n-well, which serve as barriers to minority carriers in the lateral parasitic devices. A desired p+ reachthrough would have, for example, a boron concentration of about $10^{18}$ atoms per cm$^3$ vertically through the p-type epitaxial layer thickness. This becomes difficult, however, unless excessive diffusion temperatures and times are used, particularly if it is desired to drive in the dopant simultaneously with the n-well diffusions. This is because of the drop in concentration where the downward surface diffusion meets the up-diffusing p+ substrate, resulting in a less effective barrier. Yet another isolation problem in semiconductor fabrication occurs in FET processing, in which local oxidation masking is used during a threshold adjusting implant in the field region to increase the threshold of parasitic devices. During the subsequent growth of thick oxide there is an encroachment of the field implant into the channel area which causes an effective width reduction for electrical conduction in the channel. This encroachment becomes an increasingly significant fraction of the channel width as devices are scaled down to the submicron range of very large scale integration (VLSI). Further, the abutment of an n+ diffused line against the p+ field implant results in increased depletion capacitance at the sidewall of the diffusion, which can dominate the capacitance of diffused lines.

Accordingly, it is an object of this invention to provide a method of isolating active areas in the fabrication of semiconductor integrated circuits.

Another object of this invention is to provide an isolation structure whose width is independent of its depth.

Still another object of this invention is to provide a method of fabricating semiconductor devices having a substantially increased packing density of circuit elements.

SUMMARY OF THE INVENTION

In accordance with the present invention, a pattern of submicron oxidation masking elements is formed on the surface of a semiconductor substrate. A thick oxide layer is formed on the surface of a semiconductor substrate in the areas not masked by the pattern of oxidation masking elements, which are then removed to expose the substrate in a pattern of submicron width openings. Deep, narrow grooves are formed in the substrate conforming to the pattern of openings by means of a selective anisotropic etch. The grooves are filled with an insulating material to close the openings, thus forming areas of substrate bounded by deep isolation barriers within which active devices are subsequently fabricated.

In one embodiment of the invention, a mask pattern of submicron width nitride elements is formed on a silicon substrate by an edge definition process, wherein a vertical edge of material in the desired pattern is conformally coated by a layer of nitride having a thickness substantially equal to the desired opening width. The nitride layer is anisotropically etched to remove all but the desired pattern of elements, followed by removal of the material that provided the vertical edge pattern for the conformal layer.

In another embodiment, the nitride mask pattern is formed by an undercut and backfill technique. A thick oxide layer is grown in the areas of exposed silicon and the mask is removed by a nitride etchant. After the grooves are anisotropically etched to the desired depth in the substrate, they are filled by thermal oxide growth or by a chemical vapor deposition of oxide or nitride.

According to another aspect of the invention, the grooves are first conformally converted in part by thermal oxidation and then filled by a low pressure chemical vapor deposition to avoid dislocation generation in the silicon substrate.

The present method is applied to CMOS processing to provide n-well isolation and prevent latchup in lateral parasitic devices, and to FET fabrication to avoid increased sidewall capacitance of the diffusions during threshold adjusting implants in the field regions.

In a further aspect of the invention, deep oxide barriers are used to divide the long polysilicon gateplates of a charge coupled device into individual phased gates and thereby increase the charge transfer efficiency, which can otherwise be degraded in conventional ovelapped double-polysilicon structures because of geometry-dependent potential barriers.

BRIEF DESCRIPTION OF THE DRAWINGS

The novel features believed characteristic of the invention are set forth in the appended claims. The invention itself, however, as well as further objects and advantages thereof, will be best understood by reference to the following detailed description when read in conjunction with the accompanying drawings, wherein:

DETAILED DESCRIPTION OF THE INVENTION

Figure 1:
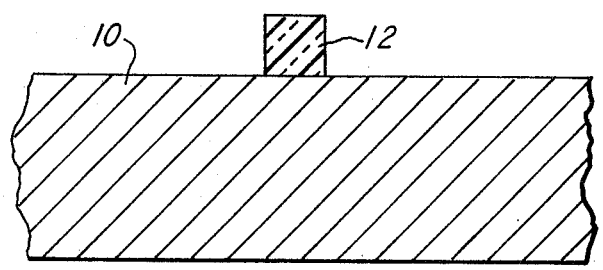
FIGS. 1–3 are partial, enlarged, vertical-sectional views of a semiconductor body illustrating various successive stages in the fabrication of a semiconductor device including an isolation structure according to the present invention.

Referring now to the drawings, there is shown in FIG. 1 a cross-sectional view of a silicon substrate 10 having a submicron width element of silicon nitride 12 formed thereon. A plurality of edge-defined elements 12 (one shown) are formed into patterns of lines enclosing areas of substrate 10 that are to be isolated from one another. In one embodiment of the present invention, the elements or lines 12 are formed by an undercut and backfill technique as disclosed in my copending application Ser. No. 175,470, entitled "Formation of Submicron Substrate Element." Using this technique, a series of masking layers is deposited on substrate 10 with the edge of the top layer being positioned at or near where the line 12 is to be formed. A portion of an intermediate layer is removed to form a cavity underneath the edge of the top layer. A conformal layer of nitride is then deposited on the structure so that the conformal layer fills the cavity. The conformal layer is removed, for example, by an anisotropic etch followed by the removal of the masking layer, leaving the desired pattern of nitride lines 12 on substrate 10. In another edge definition technique, a layer of masking material is deposited on substrate 10 and patterned so that one edge of the mask layer coincides with the desired pattern of submicron lines 12. A conformal layer of nitride having a thickness substantially equal to the width of the lines 12 is deposited on the structure and anisotropically etched. The masking material is then removed, again leaving the desired pattern of nitride lines 12 on substrate 10.

Figure 2:
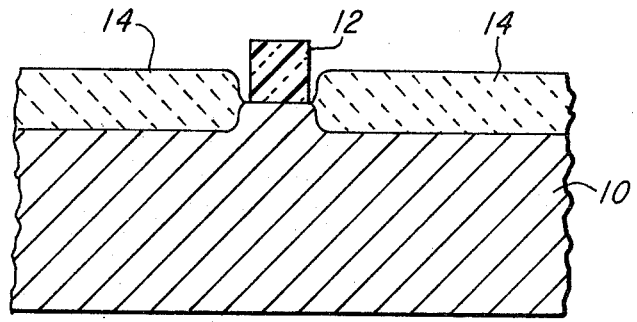
Figure 3:
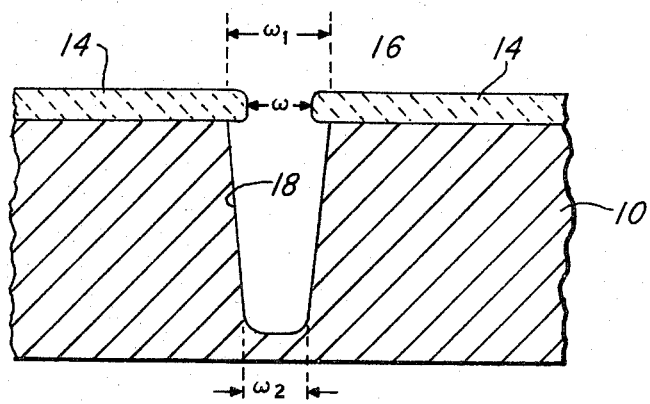

Referring now to FIG. 2, the nitride lines 12 serve as a mask for the growth of an oxide layer 14 on the exposed areas of substrate 10. The nitride lines 12 are then removed by an etchant such as $H_3PO_4$ to form a pattern of submicron width openings 16 as shown in FIG. 3. This is followed by a selective, anisotropic dry etch to form deep, narrow, substantially vertical grooves 18 in the underlying silicon conforming to the pattern of openings. A reactive ion or plasma etch, for example, a mixture of $CCl_4$, HCl and $N_2$, is particularly advantageous to achieve the desired etch characteristics. There will be some reduction of oxide layer 14 due to the lack of perfect selectivity and a slight taper of the sidewall of groove 18 due to the lack of perfect vertical anisotropy of the etch.

The grooves 18 are filled in by thermal oxidation or by low pressure chemical vapor deposition (LPCVD) of an insulating material such as oxide or nitride, the LPCVD resulting in improved conformality. The thickness of insulating material grown or deposited is chosen to just close the gap at the top of the groove.

For a groove having a width $W_1$ at the top, a thermal oxidation having a thickness of approximately $W_1$ would be required due to the silicon consumed during oxidation, and the filled-in groove would have a final width at the top of about 2 $W_1$. If LPCVD is used, the deposited thickness required is about $W_1/2$ and the final filled groove width will be about $W_1$. The preferred method of backfill is a partial thermal oxidation, in order to improve interface quality, followed by a partial CVD to minimize stresses and dislocation generation.

The dimensions of the oxide layer 14 and the completed isolation barrier formed by groove 18 will depend upon the width of the nitride element 12, the selectivity and etch rate of the silicon etchant, and the method of filling the grooves. For example, if the etchant has a silicon-to-silicon dioxide etch rate ratio of 10 to 1 and a groove 2 microns deep is required, then oxide layer 14 must have a thickness in excess of 0.2 microns. If the vertical to horizontal silicon etch rate is 20 to 1 and the width W of the nitride line 12 is 0.2 microns, groove 18 will have a width $W_1$ at the top of about 0.4 microns and a width $W_2$ at the bottom of about 0.2 microns. In filling groove 18 by thermal oxidation about 0.4 microns of oxide must be grown, whereas about 0.2 microns of oxide must be deposited in a CVD process.

A similar structure to that of FIG. 3 is disclosed in U.S. Patent application, Ser. No. 191,876, filed Sept. 29, 1980 of M. R. Oliver entitled "High Density Isolation Structure and Method". The present invention, however, provides an improved method of active device isolation wherein barriers having less than minimum lithographic dimensions are fabricated.

Figure 4:
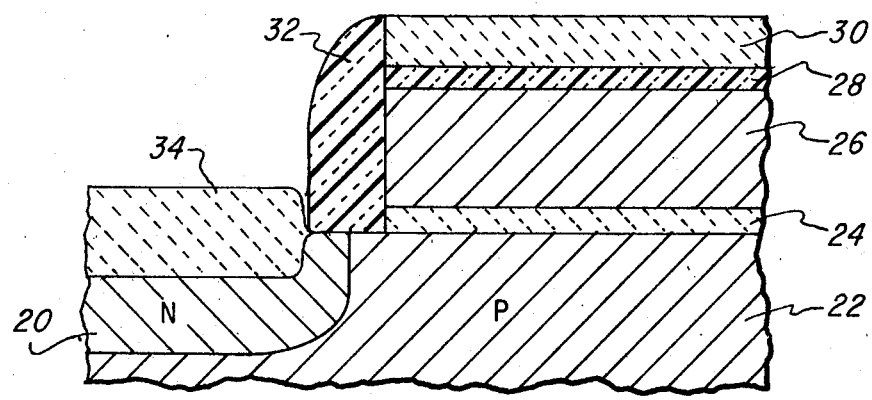
FIGS. 4–7 are similar views of intermediate steps in the fabrication of a CMOS device according to the present invention.

An example of the invention will now be described which is useful in preventing latchup of parasitic devices in CMOS integrated circuits. Referring to FIG. 4, an intermediate stage in the fabrication of a CMOS device is shown wherein an n-type region, or n-well 20 has been partially formed in a p-type epitaxial layer 22. A multilayer structure formed on layer 22 adjacent to n-well 20 includes, for example, a 1000 Angstrom oxide layer 24, a 9000 Angstrom polysilicon layer 26, a 1500 Angstrom oxide layer 28, and a 2500 Angstrom top layer 30. It is to be understood that the specific layer thicknesses are for illustrative purposes only and are not intended to be limiting features. A nitride end cap 32 formed on the vertical edge of the multilayer structure adjacent to n-well 20 and having a width of about 3000 Angstroms, forms a mask for the growth of a 6000 Angstrom oxide layer 34 over the n-well. End cap 32 may conveniently be formed by deposition of a conformal layer of silicon nitride followed by an anisotropic dry etch as described above. Polysilicon is used as an intermediate layer 26 because it can be deposited at high rates and removed with either wet or dry etches, both quickly and selectively. Further, it relieves vertical stresses in the sidewall of end cap 32 during the formation of oxide layer 34 over n-well 20.

Figure 5:
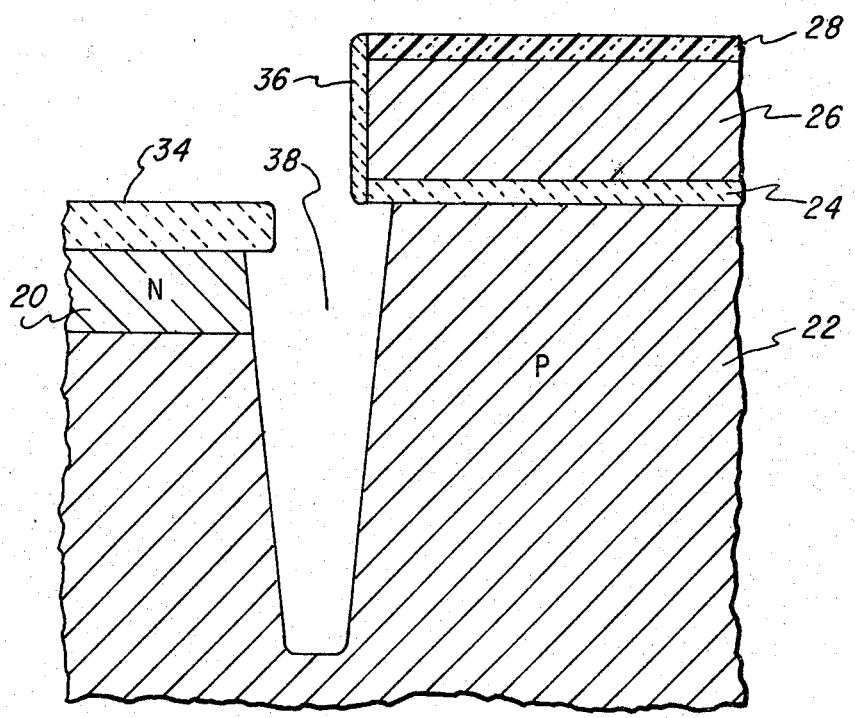

The multilayer stack thickness must be sufficient to completely mask the n-well 20 implant from the p-type region 22, and was chosen to withstand a 700 KeV $p^{31}$ implant. The oxide layer 24 beneath the poly layer 26 serves as an etch stop when layer 26 is subsequently removed. Next, end cap 32 is selectively removed by a nitride etchant such as $H_3PO_4$, followed by thermal oxidation of the exposed polysilicon sidewall to form a vertical layer 36 having a thickness of about 250 Angstroms which prevents lateral etching of layer 26 during formation of the groove in layer 22. An anisotropic selective oxide etch, to clear any oxide from the area on layer 22 that was covered by the nitride end cap 32, is followed by an anisotropic selective silicon etch to form a groove 38 in layer 22 adjacent to region 20. Groove 18 is etched to a depth of about 2.5–3.5 microns, which consumes as much as 3000 Angstroms of oxide from layer 34 over n-well 20, as well as all of layer 30 and 500 Angstroms of the nitride layer 38, resulting in the structure shown in FIG. 5. A low energy boron implant may now be made in the bottom of groove 38 to intersect the p+ boron concentration up-diffusing from the p+ substrate or to further increase the boron concentration therein.

Figure 6:
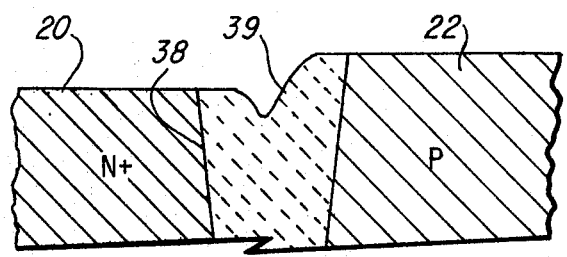
Figure 7:
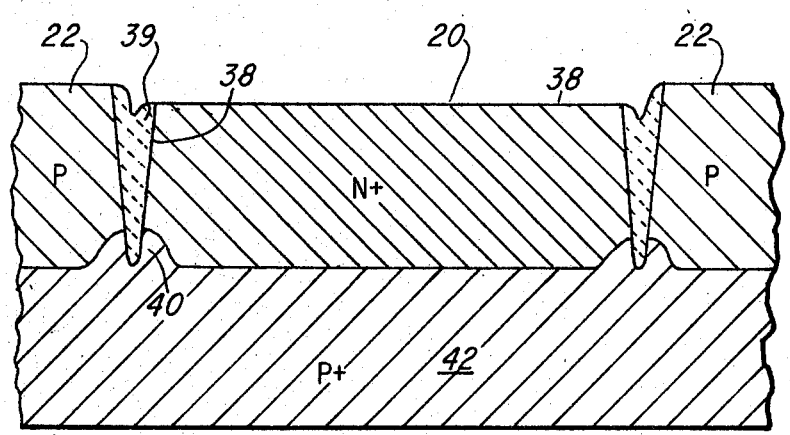
Figure 8:
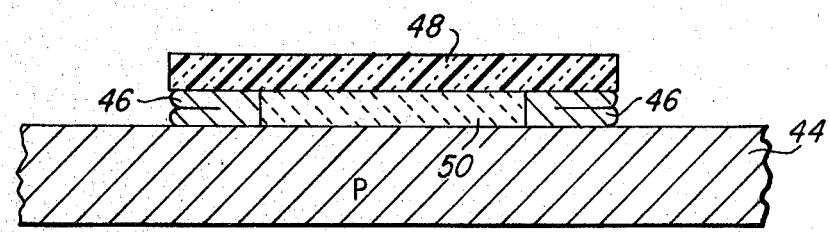
FIGS. 8–11 are enlarged, partial, cross-sectional views illustrating successive stages in the fabrication of a semiconductor device according to an alternative embodiment of the present invention.

To prepare the structure for further processing, a layer of oxide is thermally grown in groove 38 and the remaining nitride, polysilicon and oxide are stripped from the surface of the wafer. The remainder of groove 38 is filled by LPCVD oxide 39, followed by an anisotropic etchback to achieve planarity. FIG. 6 shows the surface profile of the filled groove, and FIG. 7 shows the overall CMOS structure at this stage of fabrication including the up-diffusion region 40 from the p+ substrate 42. As shown in FIG. 7, n-well 20 extends to the sidewalls of the grooves 38 which permits a maximum density of packing of p-channel devices in the n-well. In an alternative embodiment, individual n-wells may be provided for each p-channel device without impacting the circuit density. It is to be understood that the foregoing process applies equally well to the fabrication of p-well CMOS devices.

Figure 9:
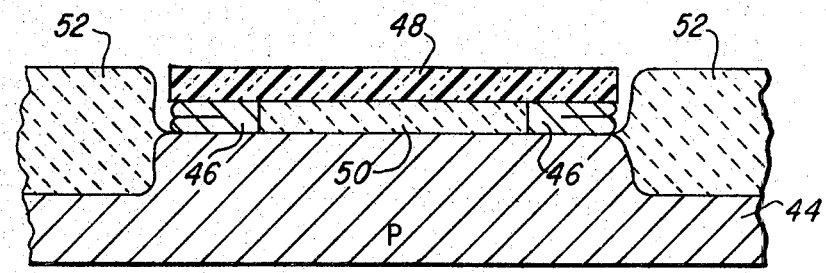
Figure 10:
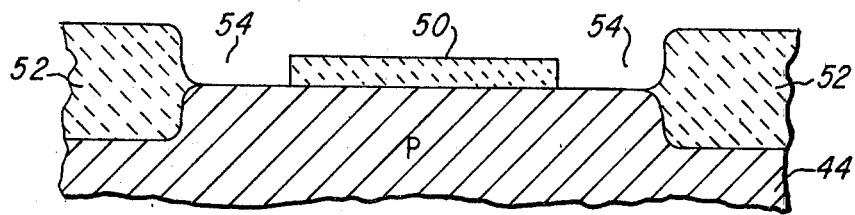
Figure 11:
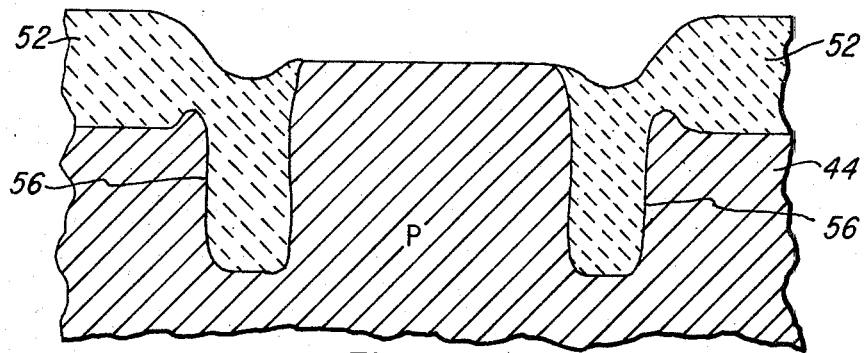
Figure 12:
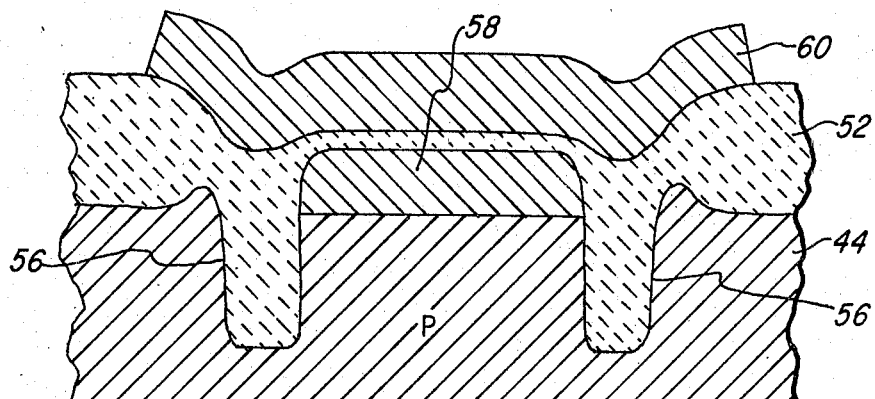
FIG. 12 is a view of an FET device fabricated according to the method of FIGS. 8–11, illustrating the isolation of the channel implant.
Figure 13:
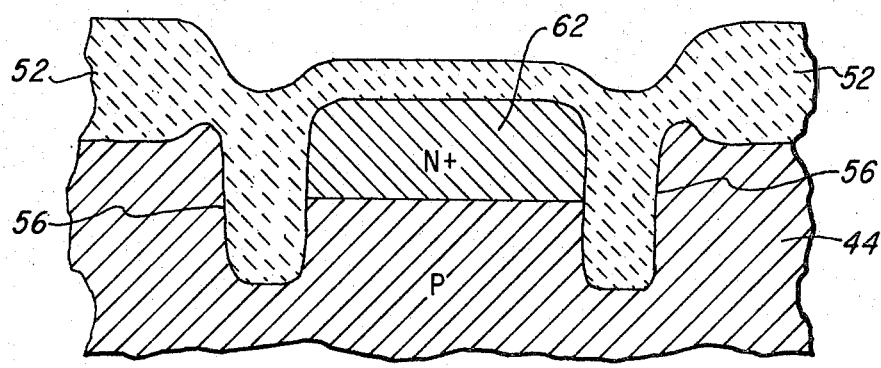
FIG. 13 is a view of the device of FIG. 12 illustrating the diffused line isolation.

Referring now to FIGS. 8–11, the steps in fabricating an FET device according to the present invention are illustrated. Starting with a p-type substrate 44, submicron nitride elements 46 are formed under a nitride top layer 48 and adjacent to an oxide island 50 by the undercut and backfill process described above. This structure serves as a mask for the growth of a thick oxide layer 52 on the exposed areas of substrate 44 as shown in FIG. 9. Nitride layer 48 and elements 46 are removed by an etchant, referring to FIG. 10, leaving submicron width openings 54. Grooves 56 are then anisotropically etched and filled with oxide, resulting in the structure of FIG. 11. Standard MOSFET processing is then used to form the channel implant 58 and polysilicon gate 60 of FIG. 12, and the n+ diffused line 62 of FIG. 13. This structure obviates the need for field implants and thus prevents the electrical encroachment of the implant into the channel area, as well as avoiding increased depletion capacitance at the sidewalls of the diffused areas.

Figure 14:
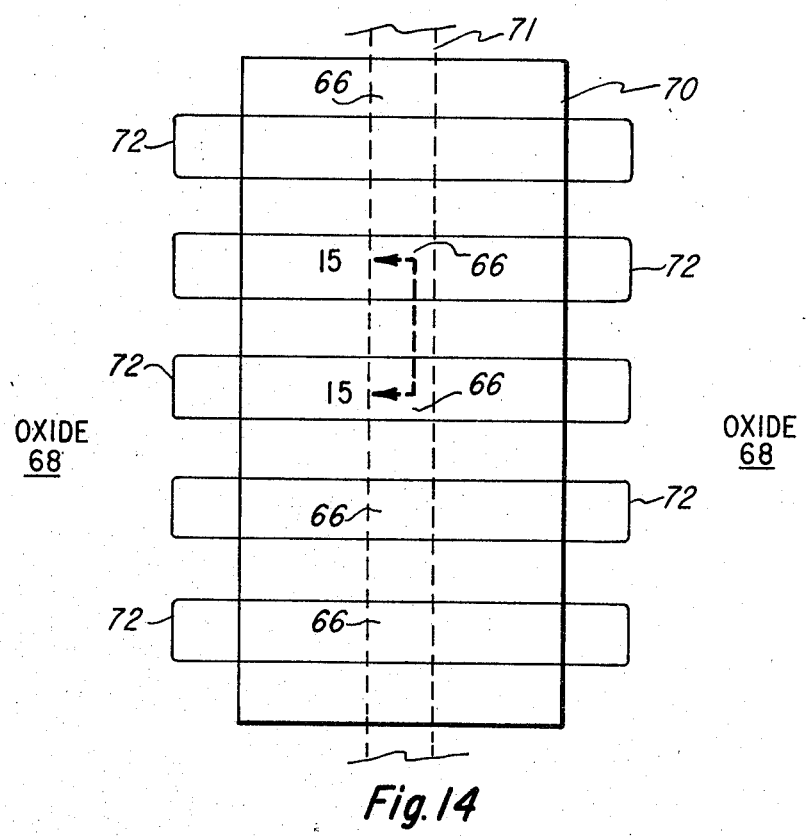
FIG. 14 is a plan view of a portion of a charge coupled device at an intermediate stage of fabrication according to the present invention.
Figure 15:
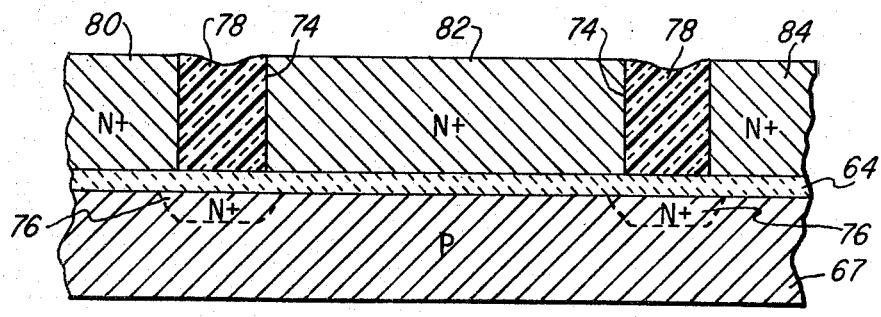
FIG. 15 is a partial cross-sectional view of the charge coupled device taken along line 15—15 in FIG. 14.

Yet another application of the present invention is in the fabrication of charge coupled devices (CCDs). Referring to FIGS. 14 and 15, there is shown a CCD at an intermediate stage of fabrication wherein a gate oxide 64 has been formed in the active device regions 66 on a substrate 67, surrounded by a thick oxide isolation region 68 and covered by a patterned polysilicon n+ gate plate 70 which overlaps both a thin oxide region 71 and the thick oxide region 68. The portion of region 71 exterior to gate plate 70 in FIG. 14 will become a diffusion area in subsequent processing steps. A pattern of submicron nitride lines 72, formed on the structure as set forth above, serve as a mask for the formation of insulating barriers, thus dividing the gate 70 into a plurality of individual phased gates. After the formation of lines 72, the exposed polysilicon is oxidized to a thickness sufficient to withstand a selective, anisotropic etch down to the gate oxide 65. For example, a poly thickness of 0.5 microns subjected to an etchant having a 10 to 1 etch rate would require a mask oxide thickness of about 750 Angstroms. The nitride lines 72 are removed and the gate plate 64 is etched to form grooves 74 therein as shown in FIG. 15, which is a partial cross-sectional view taken along line 15—15 of FIG. 14. A low dose n+ implant 76 in the bottom of each groove 74 serves as a minimum overlap capacitance diffusion between gates, which is required if the gap between gates exceeds about 0.2 microns. A low pressure CVD of nitride or oxide 78 followed by a planarizing anisotropic dry etch results in the structure of FIG. 15, wherein gate plate 70 has been divided into individual gates including gates 80, 82, and 84. The present process increases charge transfer efficiency and permits densities comparable to a conventional double-poly process, without the attendant poly-to-poly breakdown limitations or the surface potential "hump" that occurs because of geometrical oxidation effects that occur beneath the first poly edge in the double-poly process.

Various changes and modification in the above-described procedures will be readily apparent to those skilled in the art, and any of such changes or modifications are deemed to be within the spirit and scope of the present invention as set forth in the appended claims.

What is claimed is:

1. A method of forming insulating barriers in a semiconductor substrate comprising the steps of:
   forming a pattern of submicron-width oxidation masking elements on a surface of said substrate;
   forming a layer of insulating material resistant to an etchant on the exposed areas of said substrate surface;
   removing said oxidation masking elements to expose said substrate in a pattern of submicron width openings;
   anisotropically etching said substrate with said etchant to form grooves therein conforming to said pattern of openings and having a depth substantially greater than their width; and
   forming an insulating material to substantially fill said grooves.

2. The method of claim 1, wherein said substrate is silicon and said submicron-width elements are formed of silicon nitride.

3. The method of claim 2, wherein said substrate etching step comprises forming said grooves with an anisotropic plasma etch selective for silicon.

4. The method of claim 2, wherein said substrate etching step comprises forming said grooves with an anisotropic reactive ion etch selective for silicon.

5. The method of claims 3 or 4, wherein said step of forming an insulating material comprises forming silicon dioxide in said grooves by thermal oxidation.

6. The method of claims 3 or 4, wherein said step of forming an insulating material comprises forming silicon dioxide in said grooves by chemical vapor deposition.

7. The method of claims 3 or 4, wherein said step of forming an insulating material in said grooves comprises:
   partially filling said grooves with a conformal layer of silicon dioxide formed by thermal oxidation; and
   filling the remaining volume of said grooves with silicon dioxide formed by chemical vapor deposition.

8. The method of claim 6, further including the step of planarizing the surface of said silicon dioxide with an anisotropic etch.

9. The method of claim 7, further including the step of planarizing the surface of said silicon dioxide with an anisotropic etch.

10. The method of claim 7, wherein said step of forming a pattern of submicron-width oxidation masking elements comprises an edge definition process.

11. The method of claim 10, wherein said edge definition process comprises the steps of:
depositing a layer of material such that the edges of said material correspond to said pattern of said submicron-width oxidation masking elements;
conformally depositing silicon nitride atop said material;
anisotropically etching said silicon nitride until said silicon nitride has been removed except in said pattern of submicron-width oxidation masking elements; and
removing said layer of material.

12. The method of claim 1, 2, 3, or 4, wherein said step of forming a pattern of submicron-width oxidation masking elements comprises an edge definition process.

13. The method of claim 12, wherein said edge definition process comprises the steps of:
depositing a layer of material such that the edges of said material correspond to said pattern of said submicron-width oxidation masking elements;
conformally depositing silicon nitride atop said material;
anisotropically etching said silicon nitride until said silicon nitride has been removed except in said pattern of submicron-width oxidation masking elements; and
removing said layer of material.

* * * * *